United States Patent
Wang et al.

(10) Patent No.: US 11,249,243 B2
(45) Date of Patent: Feb. 15, 2022

(54) FASTENING DEVICE AND METHOD OF OPERATING SAME, AND DISPLAY PANEL

(71) Applicant: BOE TECHNOLOGY GROUP CO., LTD, Beijing (CN)

(72) Inventors: Zifeng Wang, Beijing (CN); Nannan Hu, Beijing (CN); Yan Ren, Beijing (CN); Lei Cao, Beijing (CN); She Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 613 days.

(21) Appl. No.: 16/303,967

(22) PCT Filed: Apr. 3, 2018

(86) PCT No.: PCT/CN2018/081695
§ 371 (c)(1),
(2) Date: Nov. 21, 2018

(87) PCT Pub. No.: WO2019/001063
PCT Pub. Date: Jan. 3, 2019

(65) Prior Publication Data
US 2021/0223463 A1    Jul. 22, 2021

(30) Foreign Application Priority Data
Jun. 28, 2017 (CN) .......................... 201710512142.X (51) Int. Cl.
*F21V 8/00* (2006.01)
*F16B 2/06* (2006.01)

(52) U.S. Cl.
CPC ............ *G02B 6/0086* (2013.01); *F16B 2/065* (2013.01)

(58) Field of Classification Search
CPC .................................................... G02B 6/0086
See application file for complete search history.

(56) References Cited

FOREIGN PATENT DOCUMENTS

| CN | 203696291 U | 7/2014 |
|---|---|---|
| CN | 203759412 U | 8/2014 |
| CN | 104493223 A | 4/2015 |
| CN | 107148189 A | 9/2017 |
| CN | 207011170 U | 2/2018 |

OTHER PUBLICATIONS

International Search Report dated Jun. 22, 2018 issued in corresponding International Application No. PCT/CN2018/081695.

*Primary Examiner* — Vip Patel
(74) *Attorney, Agent, or Firm* — Nath, Goldberg & Meyer; Joshua B. Goldberg (57) ABSTRACT

A fastening device, a method of operating the fastening device, and a display panel are provided. The fastening device includes a diffuser and a limiter, wherein the limiter includes a deformation portion and a non-deformation portion disposed opposite to each other to enclose a receiving portion, and the diffuser is configured to be received in the receiving portion, so as to adjust a deformation size of the deformation portion by movement of the diffuser.

20 Claims, 5 Drawing Sheets

FASTENING DEVICE AND METHOD OF OPERATING SAME, AND DISPLAY PANEL

CROSS-REFERENCE TO RELATED APPLICATION

This is a National Phase Application filed under 35 U.S.C. 371 as a national stage of PCT/CN2018/081695, filed Apr. 3, 2018, an application claiming the benefit of Chinese patent application No. 201710512142.X filed on Jun. 28, 2017, the disclosure of which is incorporated herein by reference in its entirety as a part of the present disclosure.

TECHNICAL FIELD

The embodiments of the present disclosure relate to a fastening device, a method of operating the fastening device, and a display panel.

BACKGROUND

An electronic product is assembled by various components. When assembling the components, a fastening device is generally provided between the components to achieve tight assembling.

When a fastening device is provided, a certain gap between the components of the electronic product is reserved for accommodating the fastening device. However, no matter to assemble the same components or different components, it is hard to ensure a consistent gap between the components. Thus, a special fastening device to be matched with components of different gaps of the electronic product is necessary to ensure that metrics such as assembling strength and sealing of the electronic device satisfy requirements.

However, different fastening devices are required to be matched with components of different gaps of an electronic device. Without a universe fastening device capable of being matched with components of different gaps, the design and production efficiency would be decreased.

SUMMARY

An embodiment of the present disclosure provides a fastening device, including a diffuser and a limiter, wherein, the limiter includes a deformation portion and a non-deformation portion disposed opposite to each other to enclose a receiving portion, and the diffuser is configured to be received in the receiving portion to adjust a deformation size of the deformation portion by movement of the diffuser.

Optionally, the diffuser includes: an adaptor having a long axis and a three-dimensional structure, and a connector.

The adaptor and the limiter are connected to each other through the connector.

The deformation portion includes a first side wall, the non-deformation portion includes a second side wall, and a connection wall that is horizontally disposed and connects the first side wall and the second side wall, the first side wall is provided with an opening; a cross section of the adaptor increases gradually along a direction of the long axis, so that a side surface of the adaptor forms a protrusion protruding along a horizontal direction; the adaptor is located in the receiving portion enclosed by the first side wall, the second side wall and the connection wall, and the direction of the long axis is perpendicular to the connection wall, the protrusion is disposed toward the opening and is extendible beyond the opening.

The connector is fixedly connected to the adaptor located below the connection wall via a through hole located on the connection wall.

By rotating the connector to move relative to the connection wall up and down to drive the adaptor to move up and down, the adaptor moves relative to the limiter, then changing a distance of the protrusion from the opening.

Optionally, the first side wall includes a first branch wall and a second branch wall.

Optionally, the first branch wall includes an inclined wall and a corner pointing to an inner side of the limiter.

Optionally, the connector has a threaded structure.

Optionally, the adaptor further includes a socket by which the connector is connected to the adaptor.

Optionally, the connector and the socket are provided with corresponding threads, the connector being connected to the adaptor through the threads of the socket.

Optionally, a bottom of the adaptor further includes a limiting structure, the limiting structure and the socket being located at different ends of the adaptor in the direction of the long axis.

Optionally, the second side wall of the limiter is perpendicular to the connection wall of the limiter.

Optionally, the limiter is made from a material to be an elastic limiter.

An embodiment of the present disclosure provides a method of operating the fastening device as described above, including:

placing the adaptor in the limiter, connecting the adaptor to the limiter using the connector;

rotating the connector to connect the connector to the adaptor;

after the connector is connected to the adaptor, continue rotating the connector to drive the adaptor to rotate, so that an outer perimeter of the limiter is changed.

Optionally, the receiving portion has an opening facing outward such that a diffuser is receivable in the receiving portion through the opening, and a deformation size of the deformation portion is adjusted by a depth of the diffuser into the receiving portion.

Optionally, the receiving portion is provided with threads at an inner side, and the diffuser is a screw mated with the threads.

Optionally, the deformation portion is a one-sided arc-shaped protrusion, and the one-sided arc-shaped protrusion protrudes toward the non-deformation portion when the deformation portion is not deformed.

Optionally, when the deformation portion is not deformed, an end of the deformation portion on a side opposite to the opening is substantially flush with an end of the non-deformation portion.

Optionally, the limiter further includes at least one bottom fixing portion that performs fixing.

Optionally, the opening is disposed toward a direction of the bottom fixing portion.

Optionally, the fastening device further includes two bottom fixing portions located at two opposite sides of the opening.

An embodiment of the present disclosure further provides a method of operating the fastening device as described above, including:

placing the diffuser in the limiter; and moving the diffuser into the receiving portion, so that an outer perimeter of the limiter is changed.

An embodiment of the present disclosure provides a display panel including a backlight module including the fastening device as described above for fastening a light guide plate of the backlight module.

BRIEF DESCRIPTION OF DRAWINGS

The present disclosure will be described in detail below with reference to the drawings, but the present disclosure is not limited to the following embodiments illustrated in the drawings.

DETAILED DESCRIPTION

In order to improve the accuracy of assembling an electronic product module and reduce the impact of the product's own tolerances, embodiments of the present disclosure provide a fastening device. The present disclosure will be further described in detail by the following embodiments in order to clarify the objects, technical solutions, and advantages of the embodiments of the present disclosure.

An embodiment of the present disclosure provides a fastening device including a diffuser and a limiter. The limiter includes a deformation portion and a non-deformation portion disposed opposite to each other to enclose a receiving portion, and the diffuser is receivable in the receiving portion to adjust a deformation size of the deformation portion by movement of the diffuser.

Figure 1:
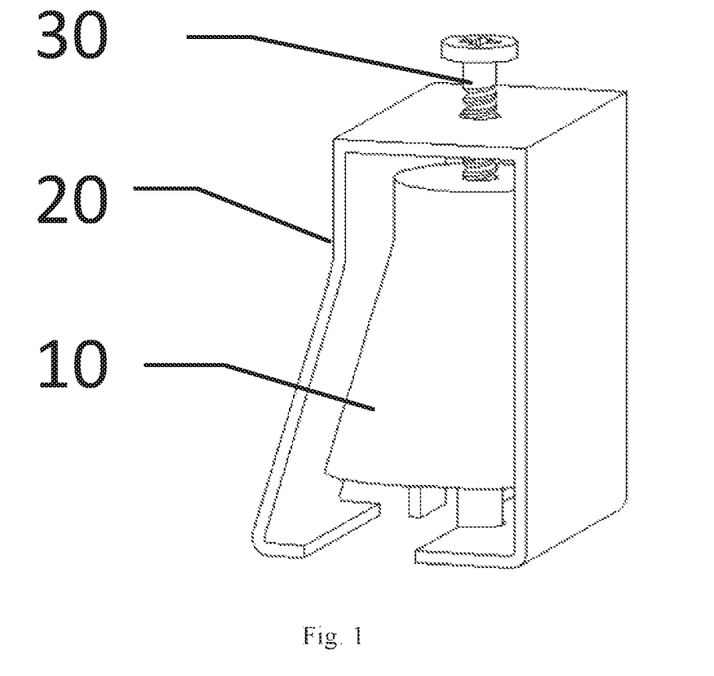
FIG. 1 is a schematic view showing an overall structure of a fastening device provided according to an embodiment of the present disclosure.

Referring specifically to FIG. 1, a fastening device provided according to an embodiment of the present disclosure includes: a diffuser having an adaptor 10 having a long axis and a three-dimensional structure and a connector 30, and a limiter 20.

The adaptor 10 and the limiter 20 are connected to each other through the connector 30.

Figure 2:
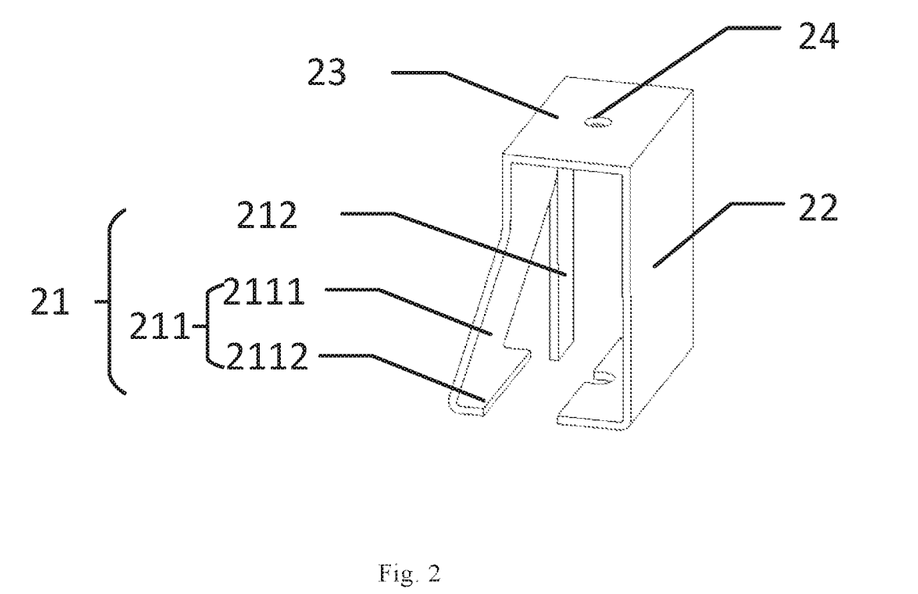
FIG. 2 is a schematic view showing a structure of a limiter provided according to an embodiment of the present disclosure.
Figure 3:
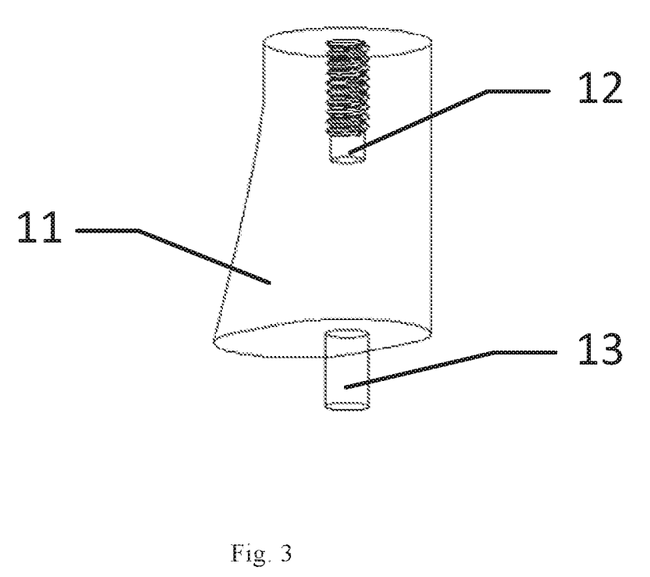
FIG. 3 is a schematic view showing a structure of an adaptor provided according to an embodiment of the present disclosure.

As shown in FIGS. 2 and 3, the limiter 20 includes a first side wall 21 as a deformation portion and a second side wall 22 as a non-deformation portion that are disposed opposite to each other, and a connection wall 23 that is horizontally disposed and connects the first side wall 21 and the second side wall 22, the first side wall 21 being provided with an opening; a cross section of the adaptor 10 increases gradually along a direction of the long axis, such that a side surface of the adaptor 10 forms a protrusion 11 protruding along a horizontal direction; the adaptor 10 is located in a receiving portion enclosed by the first side wall 21, the second side wall 22 and the connection wall 23, and the direction of the long axis of the adaptor 10 is perpendicular to the connection wall 23, the protrusion 11 is disposed toward the opening and is extendible beyond the opening.

The present fastening device is adapted to different gaps between components of an electronic product module during assembling, by using the device of the same structure, fastening and assembling of a module where gaps between the components of the module are different can be completed.

For example, the connector 30 is fixedly connected to the adaptor 10 that is located below the connection wall 23 via a through hole 24 provided on the connection wall 23.

For example, by rotating the connector 30 to move up and down relative to the connection wall 23 to drive the adaptor 10 to move up and down, the adaptor 10 moves relative to the limiter 20, such that the protrusion 11 of the adaptor 10 moves close to or away from the opening.

When the fastening device is used to fasten an electronic product module whose components have different gaps therebetween, since the adaptor 10 is movable relative to the limiter 20 and the cross section of the adaptor 10 increases gradually along a direction of the long axis, the closer the adaptor approaches the connection wall 23 of the limiter 20, the more the gap is filled by the protrusion 11 of the adaptor 10. Hence, even if the gaps of the module are different, the fastening device can be adapted to different gaps through movement of the adaptor 10.

Using the present fastening device, different gaps between components of different electronic product modules during assembling can be adapted, by using the device of the same structure, fastening and assembling of an module where gaps between the components of the module (such as a camera module, an LED module, a backlight module used in a display panel, etc.) are different can be completed, thereby improving the production efficiency.

Optionally, the first side wall 21 of the limiter 20 includes a first branch wall 211 and a second branch wall 212. In a practical application scenario, in the fastening device provided according to the above embodiment, when the adaptor 10 moves toward the connection wall 23, the first branch wall 211 will be driven to move toward the module, and then abut against the module, thus performing fastening function. The second branch wall 212 is used to limit rotation of the protrusion 11 to prevent the protrusion 11 from missing the module due to unrestricted.

Optionally, the first branch wall 211 of the first side wall 21 of the limiter 20 includes an inclined wall 2111 and a corner 2112 pointing to an inner side of the limiter 20.

Optionally, a body of the connector 30 has a threaded structure, for example, the connector 30 may be a component such as a screw or a bolt that has threads. In the present embodiment, screw is a more suitable choice.

Optionally, the adaptor 10 further includes a socket 12 by which the connector 30 is connected to the adaptor 10.

Optionally, the connector 30 and the socket 12 of the adaptor 10 are provided with corresponding threads, the connector 30 being connected to the adaptor 10 through the threads of the socket 12.

By rotating the connector 30, the connector 30 moves up and down relative to the connection wall 23 through the threads of the socket 12, and drives the adaptor 10 to move up and down, such that the adaptor 10 moves relative to the limiter 20, and thus the protrusion 11 moves close to or away from the opening.

Since the connector 30 and the socket 12 are provided with corresponding threads, the connector 30 can move up and down through the threads during rotation, so that an outer perimeter of the limiter 20 is changed, thus being adapted to different gaps of different electronic product modules.

Using the present fastening device provided according to the embodiments of the present disclosure, different gaps between components of different electronic product modules during assembling can be adapted, thus fastening and assembling of modules where gaps between the components of the modules are different can be completed by using the device of the same structure, thereby improving the production efficiency.

Optionally, a bottom of the adaptor 10 further includes a limiting structure 13, the limiting structure 13 and the socket 12 being located at different ends of the adaptor in a long axis direction.

Optionally, the second side wall 22 of the limiter 20 is perpendicular to the connection wall 23 of the limiter 20.

Optionally, the limiter 20 is an elastic limiter, that is, the manufacturing material of the limiter 20 is an elastic material.

The limiter 20 is an elastic limiter, the deformation of which varies in accordance with a magnitude of a force acted upon the limiter 20, along which an outer perimeter of the limiter 20 also varies, and further the limiter 20 is adapted to different gaps of different modules through a change of its own outer perimeter.

Thus, by using the present fastening device, different gaps of different electronic product modules during assembling can be adapted, thus fastening and assembling of modules where gaps between the components of the modules are different can be completed by using the device of the same structure, thereby improving the production efficiency.

An embodiment of the present disclosure also provides a method of operating the fastening device as described above, including:

placing the adaptor 10 in the limiter 20, connecting the adaptor 10 and the limiter 20 using the connector 30;

rotating the connector 30 to connect the connector 30 to the adaptor 10;

after the connector 30 is connected to the adaptor 10, continue rotating the connector 30 to drive the adaptor 10 to rotate, so that an outer perimeter of the limiter 20 is changed.

Hereinafter, a method of using the fastening device according to the embodiments of the present disclosure will be described in detail.

It should be illustrated that the electronic product modules mentioned in the embodiments of the present disclosure refer to various kinds of modules that may be used in manufacturing an electronic product, for example, a camera module, an LED module and the like. The fastening device in the embodiments of the present disclosure is adapted to fastening of various kinds of modules in an electronic product. For convenience of description, the embodiments described hereinafter are all directed to a backlight module used in a display panel.

Figure 4:
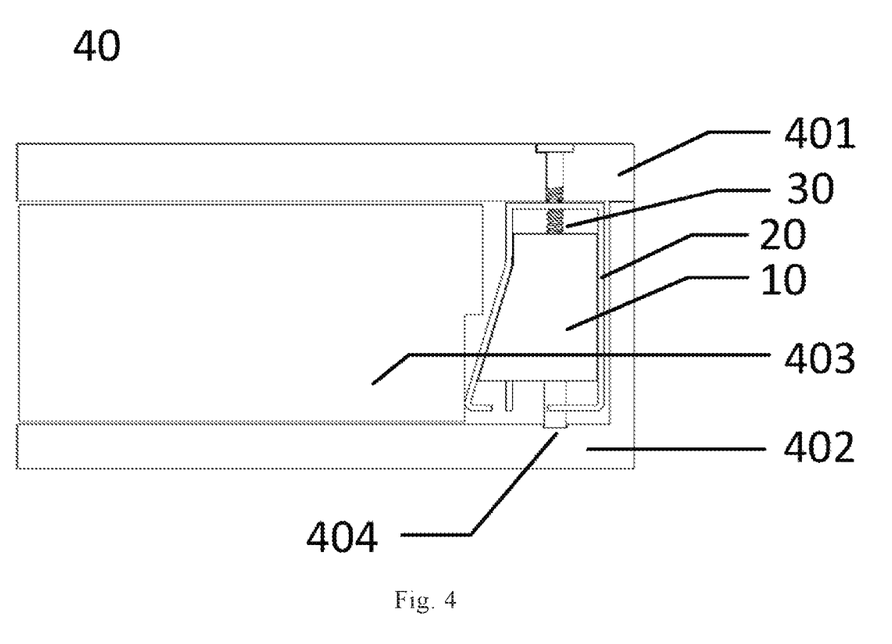
FIG. 4 is a schematic view showing a structure of a fastening device provided according to an embodiment of the present disclosure.

FIG. 4 is a schematic view showing a state in which a fastening device is placed in a functional module 40 of a common electronic product and fastened. The functional module 40 includes an upper frame 401, a lower frame 402, and a module 403. The lower frame 402 is provided with a limiting hole 404.

The module 403 may be various kinds of functional modules, for example, a chip module, an optical module and the like, and in the present embodiment, the module 403 refers to a light guide plate in a backlight module.

Referring still to FIG. 4, the limiter 20 and the adaptor 10 are placed in the module frame 40, the limiting structure 13 of the adaptor 10 is placed in the limiting hole 404 provided on an upper surface of the lower frame 402 to perform fixing function, then the module 403 is assembled on the lower frame 402, and then the upper frame 401 is assembled on the module 403. Next, the connector 30 is rotated. Before the connector 30 is rotated, the protrusion 11 is oriented substantially in a direction parallel to the module 403. The second branch wall 212 is used to limit rotation of the adaptor 10, so that the adaptor 10 cannot rotate any more after rotating by a certain extent to reach the second branch wall 212, thereby avoiding a continuous 360-degree rotation of the adaptor 10. The connector 30 is rotated, thus the connector 30 drives the adaptor 10 to rotate through the threads of the socket 12. As shown in FIG. 4, the protrusion 11 rotates to a direction substantially toward the module 403. At this time, the second branch wall 212 performs limiting function, so that the adaptor 10 cannot continue to rotate. At the same time, after the adapter 10 is rotated by about 90 degrees, the first branch wall 211 is also rotated by the protrusion 11 toward a direction of the module 403. Continuing to rotate the connector 30, in this case, the connector 30 continues to descend, and continuing to rotate the connector 30 in the same direction, which will drive the adapter 10 to move upward, and at the same time the adapter 10 drives the protrusion 11 to move upward. At this time, the inclined wall 2111 continues to shift toward the module 403 until the corner 2112 comes into contact with the module 403. At this time, continuing to rotate with constant torque, and the pressing of the corner 1112 against the module 403 generates a fastening force, and the torque and the fastening force are balanced to achieve the fastening purpose.

With this method, the fastening device of the embodiment of the present disclosure can adapt to different gaps of different electronic product modules during assembling, thus fastening and assembling of modules of different gaps can be completed by using the fastening device of the same structure, thereby improving the production efficiency.

Figure 5:
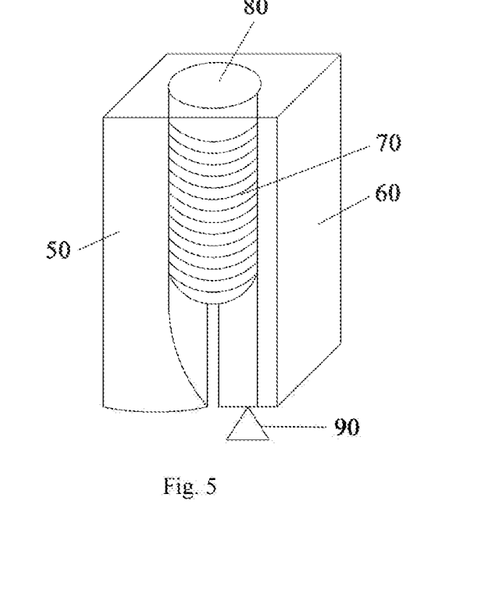
FIG. 5 is a schematic view showing an overall structure of a fastening device provided according to an embodiment of the present disclosure.

FIG. 5 is a schematic view showing an overall structure of a fastening device provided according to some embodiments of the present disclosure. This fastening device also includes a diffuser and a limiter. The limiter includes a deformation portion 50 and a non-deformation portion 60 disposed opposite to each other to enclose a receiving portion 70, and the diffuser is receivable in the receiving portion 70 to adjust a deformation size of the deformation portion 50 by movement of the diffuser.

For example, the receiving portion 70 has an opening 80 facing outward so that the diffuser is receivable in the receiving portion 70 through the opening 80, and a deformation size of the deformation portion 50 is adjusted by a depth of the diffuser into the receiving portion 70.

For example, as shown in FIG. 5, the receiving portion 70 may be provided with threads at an inner side, and the diffuser is a screw mated with the threads. As with the connector 30 in the embodiment described above, the diffuser may have a threaded structure on a body thereof, for example, the diffuser may be a component such as a screw, a bolt and the like that has threads.

For example, the deformation portion 50 may be a one-sided arc-shaped protrusion, and the one-sided arc-shaped protrusion protrudes toward the non-deformation portion 60 when the deformation portion 50 is not deformed.

For example, when the deformation portion 50 is not deformed, an end of the deformation portion 50 on a side opposite to the opening is substantially flush with an end of the non-deformation portion 60. That is, as shown in FIG. 5, the ends of the deformation portion 50 and the non-deformation portion 60 that are opposite to the opening 80 are substantially flush with each other.

For example, the limiter further includes at least one bottom fixing portion 90 that performs fixing. In the embodiment shown in FIG. 5, the opening 80 and the bottom fixing portion 90 are disposed at opposite ends of the fastening device.

Figure 6:
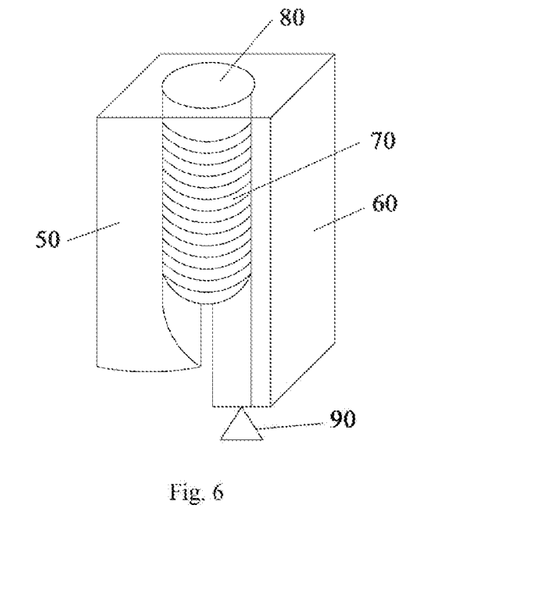
FIG. 6 is a schematic view showing an overall structure of a fastening device provided according to an embodiment of the present disclosure.

FIG. 6 is a schematic view showing an overall structure of a fastening device provided according to some embodiments of the present disclosure. Different from the fastening device shown in FIG. 5, in the fastening device in the present embodiment, the ends of the deformation portion 50 and the non-deformation portion 60 that are opposite to the opening 80 are not flush with each other. Thus, as compared to the fastening device shown in FIG. 5, the maximum deformation size of the deformation portion 50 in the fastening device shown in FIG. 6 is smaller.

Figure 7:
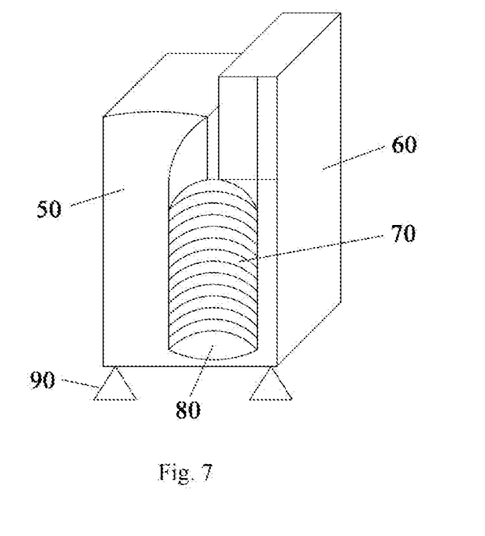
FIG. 7 is a schematic view showing an overall structure of a fastening device provided according to an embodiment of the present disclosure.

FIG. 7 is a schematic view showing an overall structure of a fastening device provided according to some embodiments of the present disclosure. Different from the fastening device shown in FIG. 6, in the fastening device of the present embodiment, the opening 80 and the bottom fixing portion 90 are provided at the same end of the fastening device, that is, the opening 80 is disposed toward a direction of the bottom fixing portion 90. At this time, two bottom fixing portions may be provided to ensure reliability of the fixing.

Figure 8:
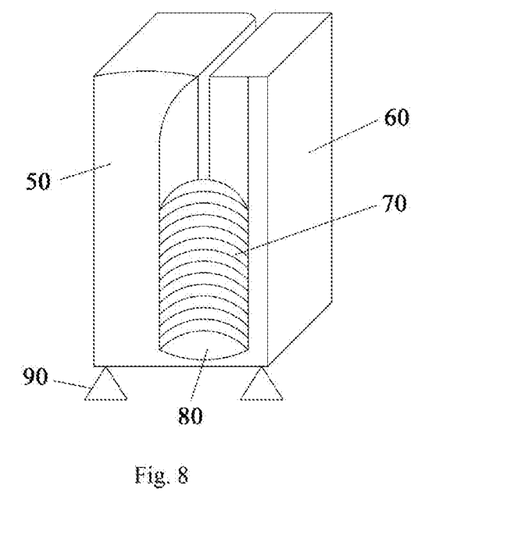
FIG. 8 is a schematic view showing an overall structure of a fastening device provided according to an embodiment of the present disclosure.

FIG. 8 is a schematic view showing an overall structure of a fastening device provided according to some embodiments of the present disclosure. Different from the fastening device shown in FIG. 7, in the fastening device of the present embodiment, the ends of the deformation portion 50 and the non-deformation portion 60 that are opposite to the opening 80 are flush with each other. Thus, as compared to the fastening device shown in FIG. 7, the maximum deformation size of the deformation portion 50 shown in FIG. 8 is larger.

Selection from the fastening devices shown in FIGS. 5 to 8 may be made depending on the assembling requirements.

Obviously, various modifications and improvements can be made to the embodiments of the present disclosure by a person skilled in the art without departing from the spirit and essence of the embodiments of the present disclosure. The invention is intended to cover these modifications and variations provided that they fall in the scope of protection defined by the following claims or their equivalents.

What is claimed is:

1. A fastening device, comprising a diffuser and a limiter, wherein,
    the limiter includes a deformation portion and a non-deformation portion disposed opposite to each other to enclose a receiving portion, and
    the diffuser is configured to be received in the receiving portion to adjust a deformation size of the deformation portion by movement of the diffuser.

2. The fastening device according to claim 1, wherein the diffuser comprises:
    an adaptor having a long axis and a three-dimensional structure, and a connector;
    wherein the adaptor and the limiter are connected to each other through the connector;
    the deformation portion includes a first side wall, the non-deformation portion includes a second side wall, and a connection wall that is horizontally disposed and connects the first side wall and the second side wall, the first side wall being provided with an opening; a cross section of the adaptor increases gradually along a direction of the long axis, such that a side surface of the adaptor forms a protrusion protruding along a horizontal direction; the adaptor is located in the receiving portion enclosed by the first side wall, the second side wall and the connection wall, and the direction of the long axis is perpendicular to the connection wall, the protrusion is disposed toward the opening and is extendible beyond the opening;
    the connector is fixedly connected to the adaptor located below the connection wall via a through hole located on the connection wall;
    by rotating the connector to move up and down relative to the connection wall to drive the adaptor to move up and down, the connector moves relative to the limiter, so that a distance of the protrusion from the opening is changed.

3. The fastening device according to claim 2, wherein the first side wall comprises a first branch wall and a second branch wall.

4. The fastening device according to claim 3, wherein the first branch wall comprises an inclined wall and a corner pointing to an inner side of the limiter.

5. The fastening device according to claim 2, wherein the connector comprises a threaded structure.

6. The fastening device according to claim 2, wherein the adaptor further comprises a socket by which the connector is connected to the adaptor.

7. The fastening device according to claim 6, wherein the connector and the socket are provided with corresponding threads, the connector being connected to the adaptor through threads of the socket.

8. The fastening device according to claim 2, wherein a bottom of the adaptor further includes a limiting structure, the limiting structure and the socket being located at different ends of the adaptor in the direction of the long axis.

9. The fastening device according to claim 2, wherein the second side wall is perpendicular to the connection wall of the limiter.

10. The fastening device according to claim 2, wherein the limiter is an elastic limiter.

11. The fastening device according to claim 1, wherein,
    the receiving portion has an opening facing outward such that the diffuser is receivable in the receiving portion through the opening, and
    a deformation size of the deformation portion is adjusted by a depth of the diffuser into the receiving portion.

12. The fastening device according to claim 11, wherein,
    the receiving portion is provided with threads at an inner side, and the diffuser is a screw mated with the threads.

13. The fastening device according to claim 11, wherein,
    the deformation portion is a one-sided arc-shaped protrusion, and the one-sided arc-shaped protrusion protrudes toward the non-deformation portion in a case where the deformation portion is not deformed.

14. The fastening device according to claim 13, wherein, in a case where the deformation portion is not deformed, an end of the deformation portion on a side opposite to the opening is substantially flush with an end of the non-deformation portion.

15. The fastening device according to claim 11, wherein, the limiter further includes at least one bottom fixing portion that performs fixing.

16. The fastening device according to claim 15, wherein, the opening is disposed toward a direction of the bottom fixing portion.

17. The fastening device according to claim 16, further comprising: two bottom fixing portions located at two opposite sides of the opening.

18. A method of operating the fastening device according to claim 2, comprising:
placing the adaptor in the limiter, connecting the adaptor to the limiter using the connector;
rotating the connector to connect the connector to the adaptor;
after the connector is connected to the adaptor, continue rotating the connector to drive the adaptor to rotate, so that an outer perimeter of the limiter is changed.

19. A method of operating the fastening device according to claim 11, comprising:
placing the diffuser in the limiter; and
moving the diffuser into the receiving portion, so that an outer perimeter of the limiter is changed.

20. A display panel comprising a backlight module, wherein the backlight module comprises a fastening device configured to fasten a light guide plate of the backlight module, wherein the fastening device is the fastening device according to claim 1.

* * * * *